United States Patent [19]
Kitano et al.

[11] Patent Number: 5,434,644
[45] Date of Patent: Jul. 18, 1995

[54] FILTER DEVICE

[75] Inventors: Junichi Kitano, Kofu; Misako Saitou, Yamanashi; Yuji Kakazu, Nirasaki, all of Japan

[73] Assignee: Tokyo Electron Limited, Tokyo, Japan

[21] Appl. No.: 245,668

[22] Filed: May 18, 1994

[30] Foreign Application Priority Data

| May 18, 1993 | [JP] | Japan | 5-140164 |
| Dec. 10, 1993 | [JP] | Japan | 5-341426 |

[51] Int. Cl.⁶ .................. G03B 27/52; G03B 27/42
[52] U.S. Cl. ........................... 355/30; 355/53
[58] Field of Search .................. 355/53, 30, 27

[56] References Cited

U.S. PATENT DOCUMENTS

| 4,760,423 | 7/1988 | Holtje et al. | 355/3 R |
| 5,023,654 | 6/1991 | Matsumoto et al. | 355/27 |
| 5,130,743 | 7/1992 | Katoh et al. | 355/27 |
| 5,143,552 | 9/1992 | Moriyama | 118/666 |

Primary Examiner—Richard A. Wintercorn
Attorney, Agent, or Firm—Oblon, Spivak, McClelland, Maier & Neustadt

[57] ABSTRACT

A filter device for a resist-treatment system, comprising a frame having an aperture through which the outside air is introduced into the resist-treatment system, a fan unit for sucking the outside air into the aperture, and a filter element supported by means of the frame so as to be situated at least on one side the fan unit, the filter element including a porous body containing an acid component capable of adsorbing an alkali component by reaction.

20 Claims, 7 Drawing Sheets

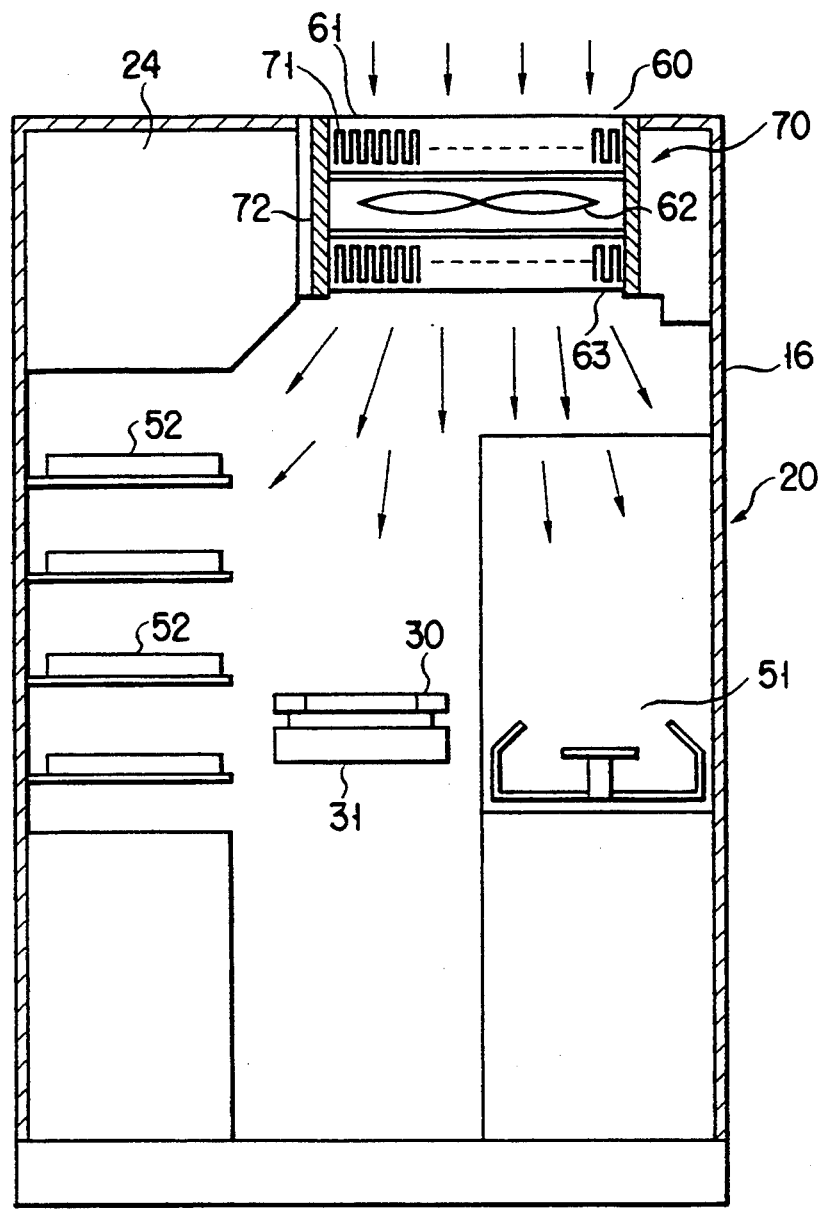
F I G. 5

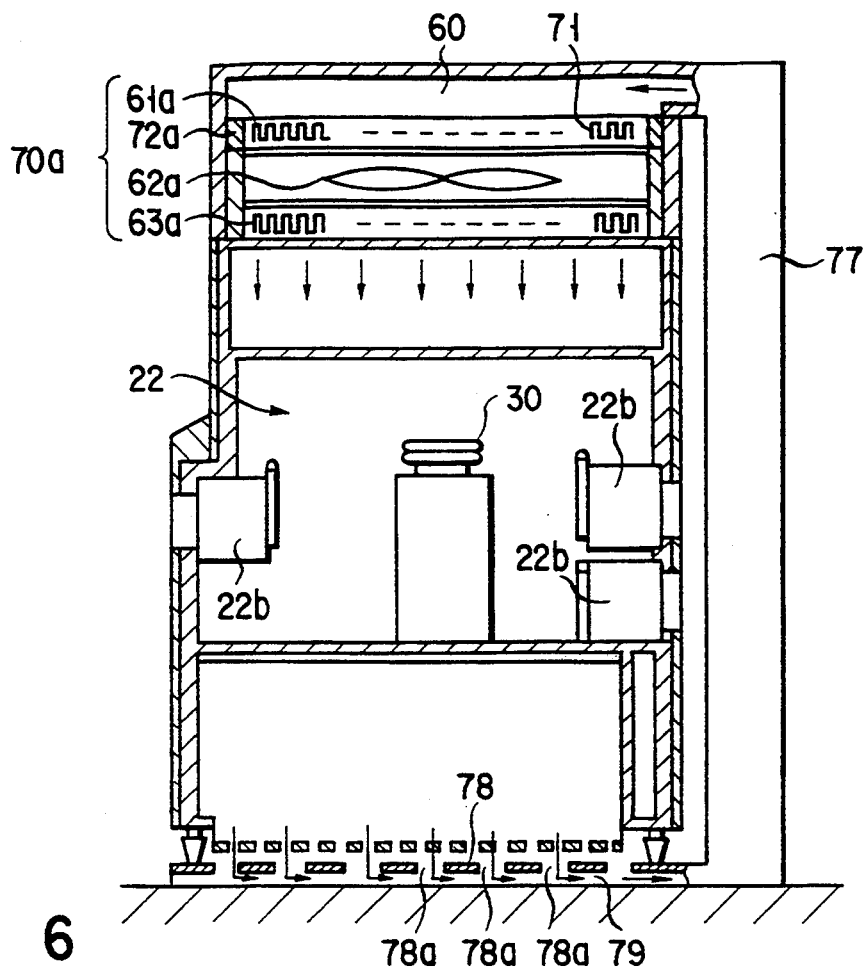
FIG. 6
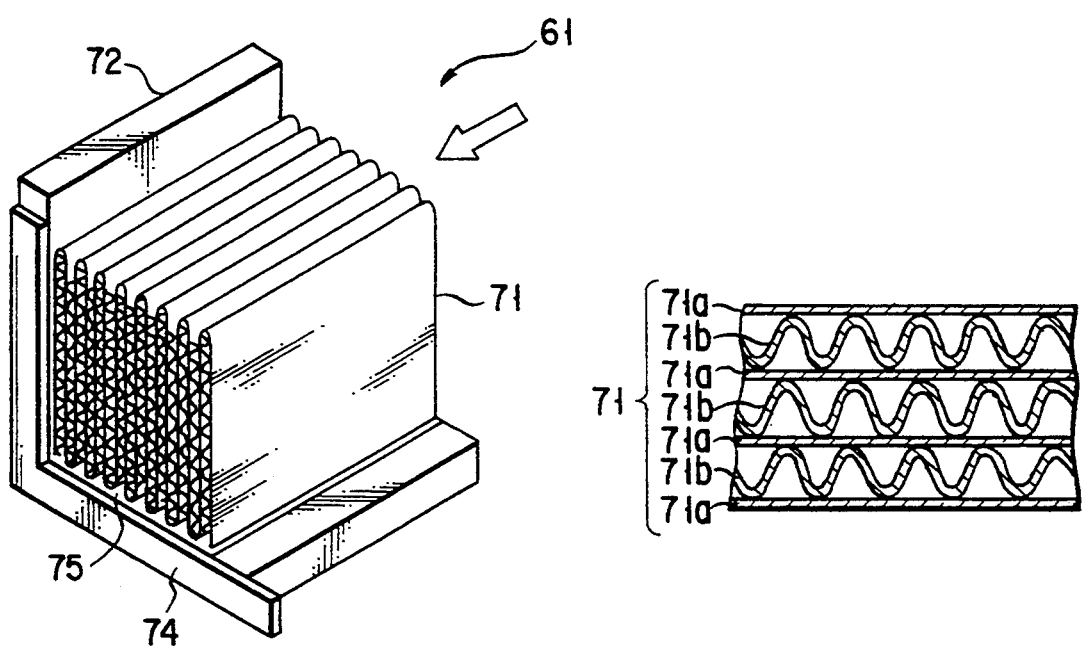
FIG. 7
FIG. 8

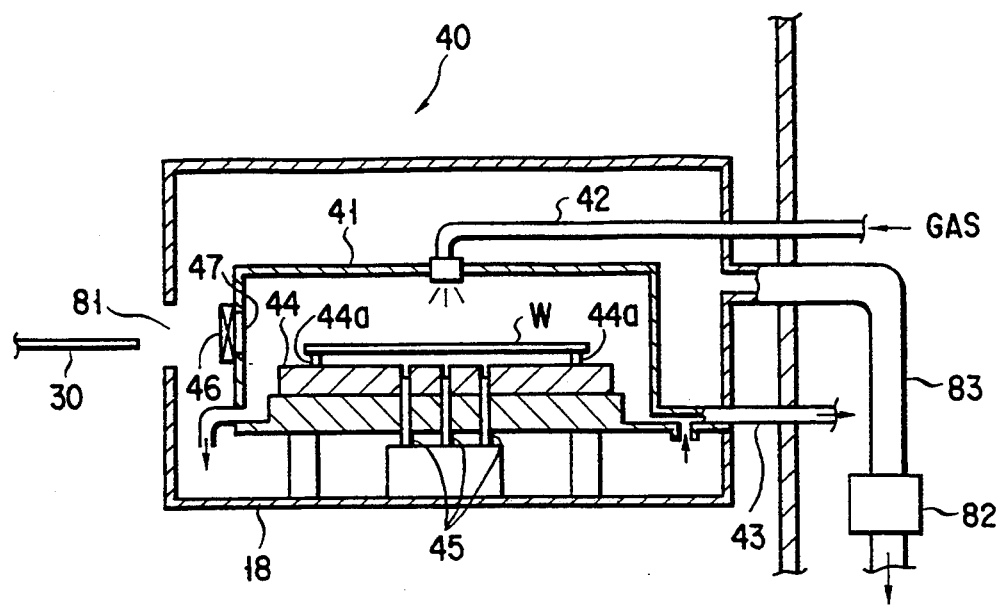
FIG. 9
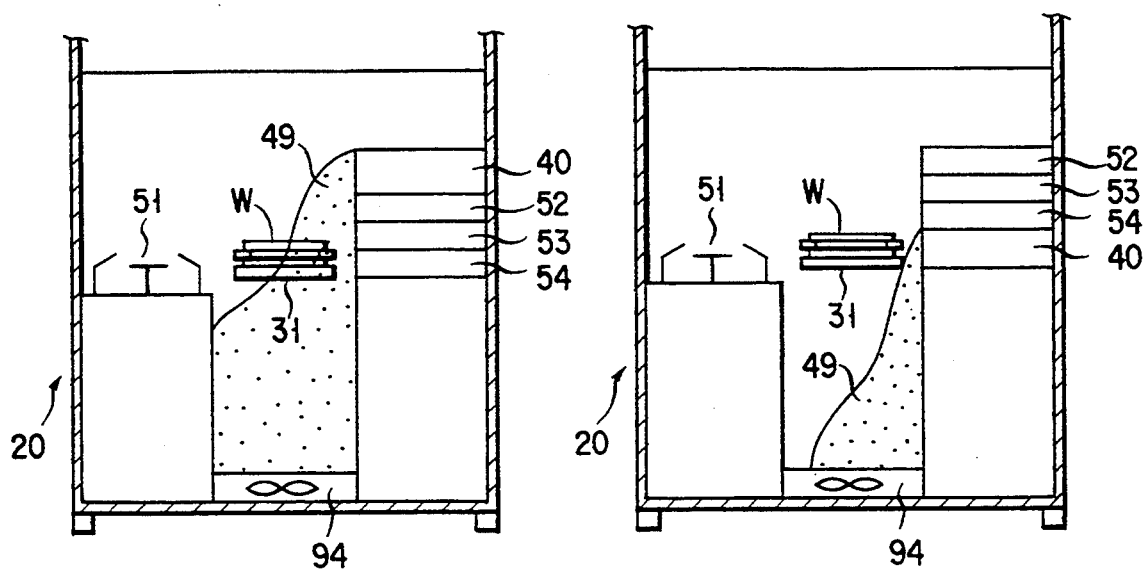
FIG. 10
PRIOR ART
FIG. 11
PRIOR ART

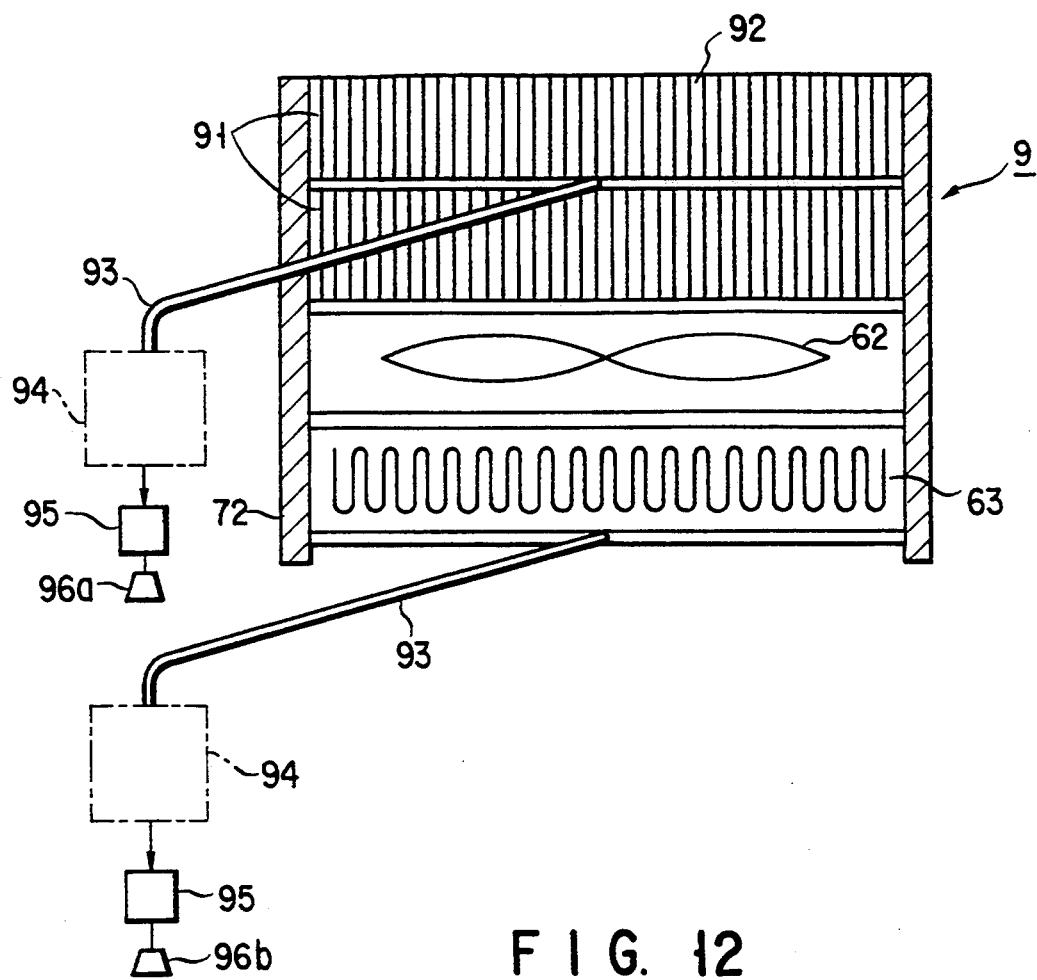
F I G. 12
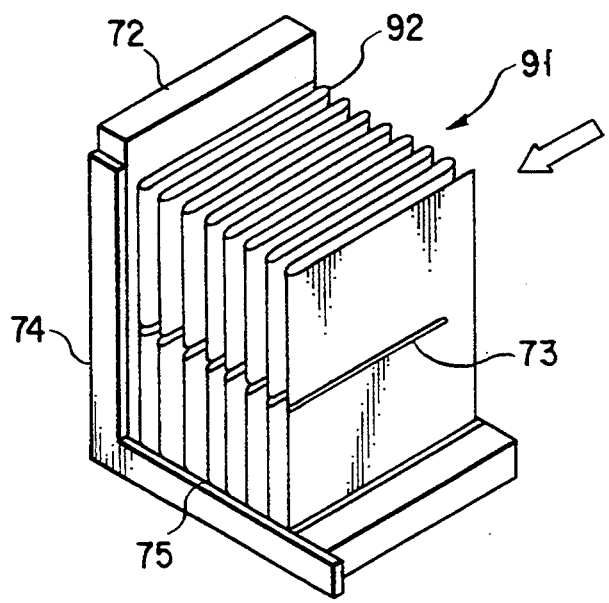
F I G. 13

FILTER DEVICE

BACKGROUND OF THE INVENTION

1. Field of the Invention

The present invention relates to a filter device used in a system for resist-treating substrates, such as semiconductor wafers.

2. Description of the Related Art

In a photoresist-treatment process for the manufacture of a semiconductor device, a resist is applied to the surface of a thin film of, e.g., $SiO_2$ formed on a semiconductor wafer, and the resulting resist film is exposed for a predetermined pattern and developed, thus forming a mask pattern. A resist-treatment system is used to carry out this process.

The resist-treatment system comprises an adhesion treatment unit, resist coating unit, exposure unit, developing unit, etc. A processing section (including all these units except the exposure unit) of the system is provided with a transportation path, and the resist coating unit and the baking unit are arranged on either side of the path. A transportation arm mechanism, which can travel on the transportation path, serves to transport the wafer to the adhesion treatment unit and the resist coating unit. The exposure unit is connected as an external mechanism to the processing section.

Photolithography has recently been improved with the rapid progress of highly integrated devices. For example, a 4-megabit DRAM, among other DRAMs, requires a pattern line width of about 0.7 to 0.8 $\mu$m. In this case, g- or i-rays are used as an exposure light source, and a novolak-based resin is used as a resist material.

However, devices of the next generation, e.g., DRAMs with a capacity of 16 or 64 megabits or more, require reduction of the source light wavelength, and ultraviolet rays, such as excimer laser beams, are expected to be used as a promising light source. Since the novolak-based resin has a considerably high absorption factor for short-wavelength light, however, the perpendicularity (shape) of an etched resist side wall is poor.

Recently, therefore, a resist material of the chemical-sensitization type has started to be used in place of the novolak-based resin. When the material of this type is exposed, an acid is generated from its sensitizer. This acid is diffused by baking, and acts as a catalyst. By the agency of the acid, a base resin, as a main component of the resist material, is decomposed or changed in molecular structure. As a result, the resist material becomes soluble or insoluble in a developing agent.

The following is a description of features of various resist materials of the chemical-sensitization type.

(1) Hydroxyl groups in a polymer, such as polyvinyl phenol, are blocked with alkyl groups and silyl groups, and this blocking is removed by means of an acid to restore the alkali solubility (positive resist).

(2) A substance with a dissolution preventing effect is mixed with the novolak resin, and a dissolution preventing component is decomposed and denaturalized to restore or accelerate the solubility by means of the catalytic effect of an acid formed by exposure.

(3) A resist material is formed from an acid generator, crosslinking agent, and base resin. The base resin is cured (crosslinked) by the crosslinking agent in an acid-catalyst condensation reaction, and this crosslinking reaction considerably lowers the solubility in a water solution of alkali.

Thus, according to the resist materials of the chemical-sensitization type, each molecule of the catalyst (acid) contributes to a plurality of chemical reactions. Theoretically, therefore, these resist materials have a higher sensitivity to light and higher light transmission in a short-wavelength region than those of the conventional ones. If excimer laser beams are used with the resist materials of the chemical-sensitization type, therefore, the light intensity distribution with respect to the film thickness direction can be eased, so that a line width of 0.3-$\mu$m level can be tackled. In forming patterns on a resist film of the chemical-sensitization type described above, however, the plane shape and depth-direction shape (contact hole shape) of each pattern are deteriorated in baking and developing processes after exposure.

In the case of the positive resist, an acid (hydrogen ions) is generated in the resist in an exposed portion $3b$, as shown in FIG. 1A, and the acid reacts to alkali components to form a neutralized layer 4, as shown in FIG. 1B. Since a compound insoluble or hardly soluble in the developing agent is formed in this neutralized layer 4, an insolublilized portion 5 remains after the development, as shown in FIG. 1C. Since the insolublilized portion 5 narrows the opening of a contact hole 6, etching defects are caused in the subsequent processes. In these drawings, numerals 2 and $3a$ denote a silicon substrate and an unexposed portion, respectively.

The alkali components are derived from a very small amount of ammonia contained in the air or an amine generated from paints on the wall or HMDS (hexamethyldisilazane) used in adhesion treatment. It is estimated that these trace alkali components react to the acid in the vicinity of the surface of the resist film.

SUMMARY OF THE INVENTION

The object of the present invention is to provide a filter device capable of removing alkali components from the outside air with high efficiency.

According to an aspect of the present invention, there is provided a filter device for a resist-treatment system, which comprises: a frame having an aperture through which the outside air is introduced into the resist-treatment system; sucking means for sucking the outside air into the aperture; and a filter element supported by means of the frame so as to be situated at least on one side the sucking means, the filter element including a porous body containing an acid component capable of adsorbing an alkali component by reaction.

When the porous body is dipped in the acid solution, the solution penetrates pores in the porous body. When the acid solution in the pores are splashed by means of a centrifugal separator, hollows are formed such that the particles of the acid solution adhere to the inner wall surface of each hollow. The density of the pores is increased by pressing the porous body. Since the pores in the porous body are shaped uniformly and arranged regularly, moreover, the specific surface area of the porous body is wide, so that the alkali components can be removed highly efficiently.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a vertical sectional view showing a processing section of the resist-treatment system;

FIG. 6 is a vertical sectional view showing an interface section of the resist-treatment system;

FIG. 7 is a cutaway perspective view of a filter unit with its internal element exposed;

FIG. 8 is a partial sectional view of a filter element;

FIG. 9 is a vertical sectional view showing an adhesion treatment unit;

FIG. 10 is a vertical sectional view showing a conventional processing section;

FIG. 11 is a vertical sectional view showing a processing section according to an embodiment of the present invention;

FIG. 12 is a front view showing a filter unit according to another embodiment of the invention; and FIG. 13 is a cutaway perspective view of the filter unit according to the second embodiment with its internal element exposed.

DETAILED DESCRIPTION OF THE PREFERRED EMBODIMENTS

Various embodiments of the present invention will now be described in detail with reference to the accompanying drawings.

Figure 1A:
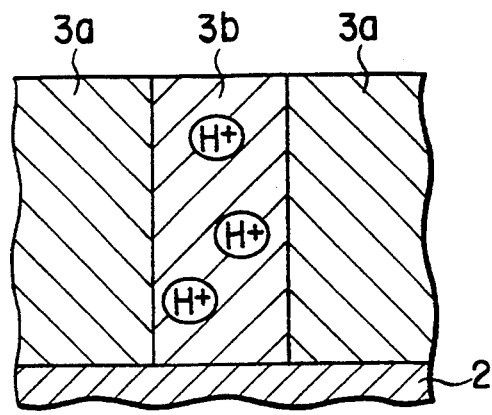
FIGS. 1A, 1B and 1C are vertical sectional view for illustrating conventional processes for developing a resist film.
Figure 1B:
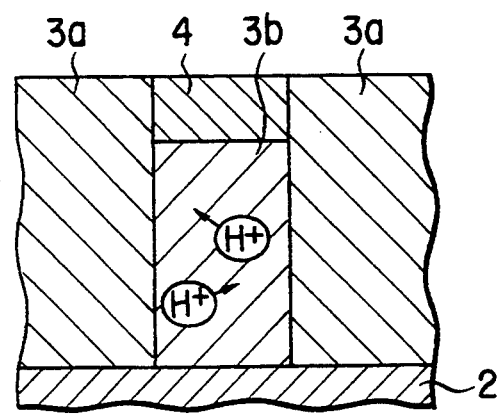
Figure 1C:
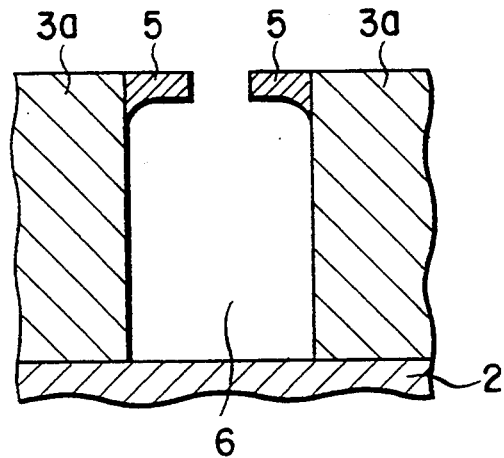
Figure 2:
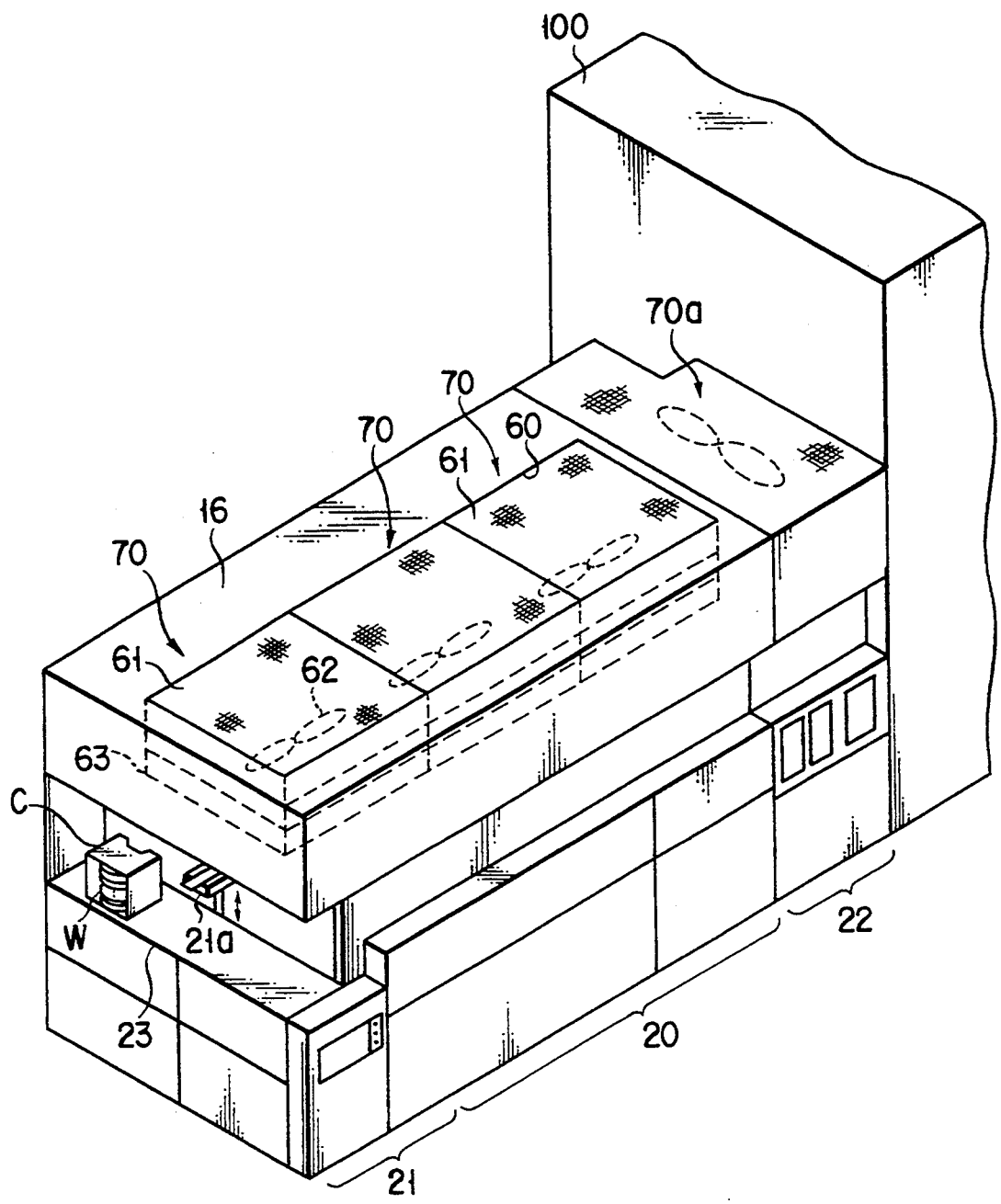
FIG. 2 is a perspective view showing an outline of a resist-treatment system.
Figure 3:
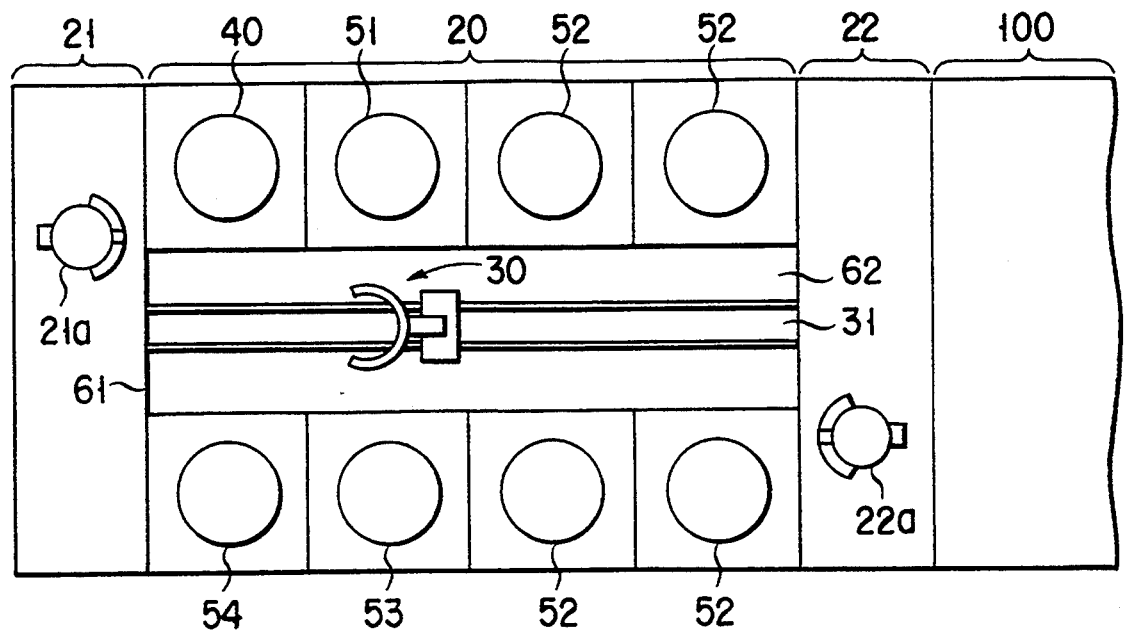
FIG. 3 is a plan view schematically showing an internal layout of the resist-treatment system.
Figure 4:
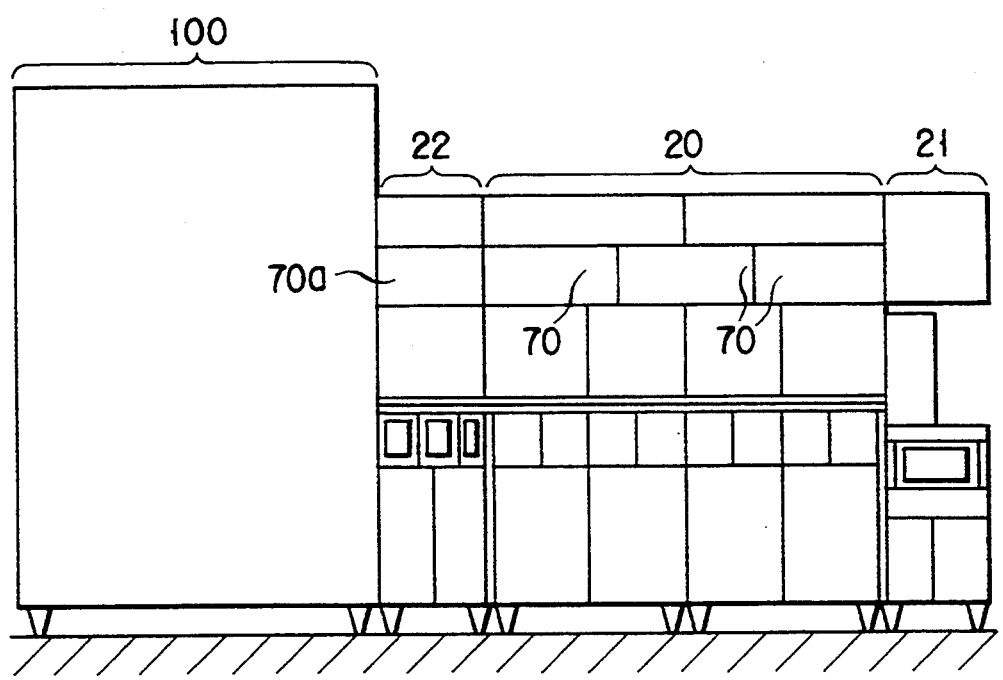
FIG. 4 is an external side view showing the resist-treatment system.

As shown in FIGS. 2, 3 and 4, a resist-treatment system comprises a processing section 20, a loading/unloading section 21, an interface section 22, and an exposure section 100. The processing section 20 is provided with a transportation path 31, on which a robot 30 travels. The path 31 extends from the loading/unloading section 21 to interface section 22, and semiconductor wafers W are transported along the path 31 by means of an arm mechanism of the robot 30. Treatment units 40, 51, 52, 53 and 54 are arranged on either side of the path 31. The exposure section 100 is connected to the processing section 20 by means of the interface section 22.

The loading/unloading section 21 includes a cassette stage 23. The stage 23 is provided with a transfer mechanism 21a, whereby a wafer cassette is moved in the directions of X- Y, Z- and θ-axes. A transfer mechanism 22a of the interface section 22 is constructed substantially in the same manner as the mechanism 21a.

In the adhesion treatment unit 40, the surface of each wafer is made hydrophobic by means of a vapor of HMDS (hexamethyldisilazane), whereby the adhesion of a resist film to the wafer surface is improved. In the resist coating unit 51, a resist liquid of the chemical-sensitization type is applied uniformly to the wafer.

Each of four baking units 52 includes a heating plate for heating the wafers W. In the units 52, a solvent is evaporated from the resist material applied to the wafers W, or the exposed resist film is baked to diffuse an acid produced during exposure. The throughput can be improved by alternately using the four baking units 52. The cooling unit 53 is used to cool the wafers W after the adhesion treatment in the treatment unit 40 and before the resist coating in the coating unit 51. The developing unit 54 develops the exposed wafers W from the baking units 52 by means of an alkaline developing agent. A power unit 24 and filter units 70 are arranged on the top the processing section 20 and the loading/unloading section 21. Only a filter unit 70a is located in the top portion of the interface section 22.

As shown in FIG. 5, the whole system is concealed under a cover 16, and an air intake aperture 60 is formed in the top face of the cover 16. Wafer inlet and outlet apertures are formed individually in the front and rear faces of the cover 16. The cover 16, which need not be an integral structure, may be formed by combining separate bodies in consideration of ease of maintenance, transportation, etc.

As shown in FIG. 6, a punching metal plate 78 underlies the processing section 20, loading/unloading section 21, and interface section 22. Down-flow air flows into an under-the-floor space 79 through a hole 78a in the plate 78. A duct 77, which is located outside the cover 16, communicates with both the air intake aperture 60 and the space 79. Air circulates through the filter unit 70a, interface section 22 (or processing section 20), space 79, and duct 77 (semi-closed system).

As shown in FIG. 2, the three filter units 70 are arranged in the air intake aperture 60 corresponding to the processing section 20 and the loading/unloading section 21. On the other hand, the filter unit 70a is provided in the top portion of the interface section 22 (or processing section 20).

As shown in FIG. 5, each filter unit 70 is surrounded on all sides by a support frame 72. A first filter section 61, a fan 62, and a second filter section 63 are arranged from top to bottom in the frame 72. Since the first and second filter sections 61 and 63 in the filter unit 70 are removable from the support frame 72, they can be easily replaced with new ones.

The first filter section 61 is a chemical filter for restricting the concentrations of alkali components, such as ammonia, amine, etc., in the air to the order of several ppb or less. The second filter section 63 is used to remove particles in the air.

As shown in FIG. 7, an element 71 of the first filter section 61 is in the form of a bellows composed of bent sheets 71a. Air passes between the sheets 71a. As shown in FIG. 8, a member 71b is sandwiched between each two adjacent sheets 71a so that the filter element 71 has a honeycomb structure as a whole. The sheets 71a and the members 71b are formed of carbon fibers. Phosphoric acid is attached to the element 71.

The second filter section 63 is constructed in the same manner as the first filter section 61, except that a glass fiber sheet is used as the material of the filter element and phosphoric acid is not attached to the sheet. Preferably, the material of gaskets used in the first and second filter sections 61 and 63 should be selected among ones, such as silicone rubber, PVC, etc., which produce little ammonia. These materials were dipped in superpure water, and the quantity of elution of ammonia was measured. Thereupon, the quantity was found to be 20 ng/cm² or less, indicating no substantial production of ammonia in the air.

The following is a description of resist-treatment of the wafers W by means of the system constructed in this manner.

Eight-inch wafers W are carried into the processing section 20, subjected to adhesion treatment, cooled, coated with the resist material, and baked. Then, the wafers W are delivered through the interface section 22 to the exposure section 100, whereupon they are exposed. After they are returned to the processing section 20, the wafers W are put into the baking units 52. When the wafers W are baked, an acid is produced in the exposed portion of the resist film. Then, the acid diffuses in the resist film, causing an acid catalyst reaction. Thus, the resist film becomes soluble in the developing agent.

The outside air is sucked into the processing section 20 by means of the fan 62 of each filter unit 70. The outside air (e.g., air in a clean room) contains a very small amount of alkali components, such as ammonia, amine, etc., from paints on the wall or the like. These alkali components are neutralized by phosphoric acid and trapped as they pass through the element 71 of the first filter section 61.

Table 1 shows the results of examination of the efficiency of collection of ammonia in the air by means of filter elements of various materials treated with acids.

TABLE 1

| Sample No. | Element; | Acid Component; | Form; | Column Inlet Concentration (ppb); | Column Outlet Concentration (ppb); | Collection Efficiency (%) |
|---|---|---|---|---|---|---|
| Sample 1: | Zeolite; | Phosphoric acid; | Porous Pellets | 15.87 | 0.15 | 99.1 |
| Sample 2: | Activated carbon; | Phosphoric acid; | Porous Pellets | 12.51 | 0.06 | 99.5 |
| Sample 3: | Olefin fibers; | Sulfonic acid; | Cloth | 10.76 | 0.11 | 99.0 |

Each of samples 1 to 3 is 49 mm in thickness. The thickness of Sample 3 may be 0.79 mm. The average fineness of the fibers of Sample 3 is 15 μm.

In the elements of Samples 1 and 2, phosphoric acid is physically adsorbed by zeolite and activated carbon, respectively. The activated carbon is not limited to the pellet type (porous materials), and may be in the form of fibers (so-called carbon fibers). When using the carbon fibers for the filter elements, a plurality of carbon fiber sheets are stacked in layers. The average fineness of the carbon fibers is 15 μm. In the element of Sample 3, a sulfonic group is chemically bonded to a base polymer of olefin fibers.

In Samples 1, 2 and 3, the ammonia concentration was able to be reduced from 15.87 to 0.15 ppb, from 12.51 to 0.06 ppb, and from 10.76 to 0.11 ppb, respectively. In any of the samples, an ammonia collection efficiency of 99% or more was obtained.

According to the filter device constructed in this manner, neutralization of the acid in the resist film is restrained in the processing section 20, and the exposed portion is securely made soluble in alkali, so that the resist film can be developed with high accuracy.

According to the filter device described above, the coated wafers W are left in an atmosphere with a very low alkali concentration before they are carried out through the outlet aperture, so that the alkali components can be restrained from being adsorbed by the surface portion of the resist film.

various materials, such as APEX-E (trade mark; IBM Co., Ltd.), AZ-DX46 (trade mark; HOECHST Co., Ltd.), and AXT-248 (trade mark; SHIPLAY Co., Ltd.), may be used as the resist material of the chemical-sensitization type. The exposed wafers W were left to stand for a predetermined period of time in atmospheres with ammonia concentrations of 1 ppb and 10 ppb. Thereupon, the patterns of the wafers W in the former atmosphere drastically got out of shape, although the wafers W in the former atmosphere cleared an acceptance criterion, an error of ±0.3% with respect to the pattern line width. Thus, the ammonia concentration of the resist material of the chemical-sensitization type should be 1 ppb or less, preferably 0.7 ppb or less.

Preferably, according to the present invention, the adhesion treatment unit 40 should be constructed in the manner shown FIG. 9. In FIG. 9, numeral 41 denotes a closed container which is vertically separable. A gas supply pipe 42 for HMDS gas supply is connected to the center of the upper portion of the container 41, and a first exhaust pipe 43 to the lower portion of the container 41. A hot plate 44 is located at the bottom of the container 41. Three retaining pins 45 are arranged so that they can project above or retreat beneath the upper surface of the plate 44. Each wafer W is supported by means of projections 44a so that its reverse side is kept apart from the hot plate 44. Formed in a lateral face of the closed container 41 is a wafer inlet-outlet aperture 47 which is opened and closed by means of a gate 46.

The closed container 41 is surrounded by a cover 18, which is provided with a wafer inlet-outlet aperture 81 and a second exhaust pipe 83. The pipe 83 communicates with the suction side of an exhaust pump 82. An end portion of the second exhaust pipe 83 connects with a duct in the clean room.

According to the adhesion treatment unit 40 constructed in this manner, HMDS gas is supplied from above the center of the wafer W in the closed container 41, whereupon the wafer W is subjected to adhesion treatment. Thereafter, the gas is discharged through the first exhaust pipe 43 as an inert gas is fed through the gas supply pipe 42. The gate 64 is opened when the atmospheric pressure is restored in the container 41. As this is done, HMDS on the inner wall surface of the closed container 41 scatters, and a very small amount of HMDS leaks from the container 41. In this case, an amine-based component contained in HMDS never leaks out of the container 41, since the container 41 is enclosed by the cover 18, and the inside of the cover 18 is continually exhausted.

Referring further to FIGS. 10 and 11, the adhesion treatment unit 40 will be described.

Preferably, the adhesion treatment unit 40 should be located on the lowest stage of the processing section 20, as shown in FIG. 11. This is because if the unit 40 is set on the highest stage, as shown in FIG. 10, a leaked HMDS gas 49 spreads extensively in the processing section 20, carried by a down flow of air, and touches the wafer W. In order to prevent the resist film from being contaminated by the amine-based component contained in the gas 49, therefore, it is advisable to locate the unit 40 on the lowest stage. If the adhesion treatment unit 40 is set on the lowest stage, as shown in FIG. 11, the leaked HMDS gas 49 spreads only to a very narrow region in the processing section 20, so that the wafer W cannot be contaminated by the amine-based component.

The adhesion treatment unit 40 is not underlain by any other treatment units, and is situated substantially on the same height level as the transportation path 31. Accordingly, the diffusion region of the leakage gas 49 hardly overlaps the path 31. Practically, therefore, the wafer W cannot be contaminated by the amine-based component.

Possibly, the atmosphere in the adhesion treatment unit 40 may be replaced with an inert gas so that the amount of the scattered amine-based component is reduced. In order to restrict the concentration of the amine-based component to a very low level (several-ppb order), however, the gas in the unit 40 must be replaced for a long period of time, thus inevitably lowering the throughput.

Referring now to FIGS. 12 and 13, another embodiment of the present invention will be described.

As shown in FIG. 12, a filter device 9 of this embodiment comprises a first filter section 91, which includes two elements 92, and two sets of a gas collecting pipe 93, measuring unit 94, and a detecting unit 95. An intake port of the one gas collecting pipe 93 is situated between the two elements 92 of the first filter section 91. An intake port of the other gas collecting pipe 93 is situated under an element of a second filter section 63 (on the outlet side of the filter device 9). Each collecting pipe 93 communicates with its corresponding measuring unit 94, which is connected to each corresponding detecting unit 95. A pH measuring device based on gas chromatography, ion chromatography, or gas electrodes is used as the measuring unit 94. A first alarm 96a is connected to the one detecting unit 95, and a second alarm 96b to the other detecting unit 95.

As shown in FIG. 13, each filter element 92 is a carbon fiber sheet bent in the form of a bellows (pleated structure). The peripheral portion of the element 92 is attached to a support frame 72 by means of a sealing layer 75 so that the outside air circulates along the bent surface of the element 92. The air flows through a slit 73 to the lower-course side. A gasket 74 is mounted on that portion of the frame 72 which faces a fan 62. The element 92 is formed by dipping a carbon fiber network (sheet knitted with carbon fibers) in a phosphoric acid solution, splashing some of the phosphoric acid solution out of pores of the network by means of a centrifugal separator, and then pressing the resulting structure into a plate.

As the outside air passes through the first filter section 91, alkali components in the air, mainly including an amine-based component, are neutralized by phosphoric acid and trapped. The outside air is periodically collected by means of the first gas collecting pipe 93 as it moves from the upper element 92 to the lower element 92, and bubbles into a water solution in the corresponding measuring unit 94. When the concentration of the amine-based component measured by means of the measuring unit 94 exceeds a fixed value, the corresponding detecting unit 95 delivers a command signal to the first alarm 96a, whereupon an alarm sound is outputted from the unit 96a. Hearing the alarm sound, an operator replaces the filter element or elements 92 with another one or ones. In this case, both of the two elements may be replaced with new ones. Alternatively, the upper filter element 92 may be replaced with the lower one. In this case, only one new element is expected to be mounted on the lower side.

According to the filter device of this embodiment, the adsorbing capability of the filter elements 92 for the amine-based component lowers downstream, so that the alarm 96a of that detecting unit 95 which takes in the air passed through the first element sounds before the second alarm 96b does. When the predetermined value is exceeded by the concentration of the amine-based component between the first filter elements 92, therefore, the upper element 92 must only be replaced, and the wafers in the device need not be disposed of. In replacing the first filter elements 92, all the elements may be replaced when the first alarm 96a sounds, for example, or the lower element 92 may be replaced with a time lag.

When the filter unit 9 is located so that the bent surface of each element 92 is ventilated, as shown in FIG. 13, the element 92 is subject to a great air resistance. Thus, the fan 62 requires a considerable capacity if the first filter section 91 is arranged in two stages. Practically, therefore, it is difficult to design a multistage filter section. If the elements 92 are arranged in the manner according to the present embodiment, however, the air resistance to the first filter section 91 is small, so that a pressure loss is also small. Accordingly, the outside air can be sucked in satisfactorily by means of the fan 62, so that the first filter section 91 can enjoy a multistage structure.

The filter elements according to this embodiment are formed by dipping the carbon fiber network with a wide specific surface area in the acid solution, splashing the solution by means of the centrifugal separator, and then pressing the resulting structure. Accordingly, the filter elements enjoy a wide alkali adsorbing region, high-density arrangement, and high alkali adsorption efficiency.

Since the amine-based component is easily diffusible, it can be removed satisfactorily with use of the elements 92 arranged in this manner.

The material of the first filter elements 92 is not limited to the one used in connection with the embodiments described herein, and may be particles or a network of zeolite or activated charcoal. Moreover, the acid component attached to the elements is not limited to phosphoric acid, and may be sulfonic acid or the like. Alternatively, the filter elements may be formed ion exchange fibers or the like. Fibrous filter elements are preferred since they produce less particles.

If the fan 62 is located between the first and second filter sections 61 (or 91) and 63, the velocity of the wind in the processing section 20 can be adjusted to a desired range of 0.2 to 0.4 m/sec.

Also, the present invention may be applied to a system in which a coating device and a developing device are arranged separately. In the case where the coating and developing devices are connected to an exposure unit by means of, e.g., a transportation path, moreover, a filter unit may be provided on a cover member which covers the whole structure. Besides the semiconductor wafers, glass substrates for LCD may be used as substrates to be treated.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A filter device for a resist-treatment system, comprising:
   a frame having an aperture through which the outside air is introduced into the resist-treatment system;
   sucking means for sucking the outside air into the aperture; and
   a filter element supported by means of the frame so as to be situated at least on one side the sucking means,
   the filter element including a porous body containing an acid component capable of adsorbing an alkali component by reaction.

2. A filter device according to claim 1, wherein said filter element is formed by dipping the porous body in an acid solution, splashing some of the acid solution out of pores in the porous body by means of a centrifugal separator, and then pressing the resulting structure into a plate.

3. A filter device according to claim 1, wherein said porous body is formed of activated charcoal.

4. A filter device according to claim 1, wherein said porous body is formed of carbon fibers.

5. A filter device according to claim 1, wherein said porous body is formed of zeolite.

6. A filter device according to claim 1, wherein said porous body is formed of ion exchange fibers.

7. A filter device according to claim 1, wherein said porous body is formed of olefin fibers.

8. A filter device according to claim 1, wherein said acid component is phosphoric acid.

9. A filter device according to claim 1, wherein said acid component is sulfonic acid.

10. A filter device according to claim 6, wherein a sulfonic group is chemically bonded to a base polymer of the ion exchange fibers.

11. A filter device according to claim 7, wherein a sulfonic group is chemically bonded to a base polymer of the olefin fibers.

12. A filter device according to claim 1, wherein said filter element is a porous sheet having a honeycomb structure.

13. A filter device according to claim 1, wherein said filter element is a porous sheet having a pleated structure.

14. A filter device according to claim 13, wherein said filter element includes a pleated porous sheet having a slit on the air outlet side thereof.

15. A filter device according to claim 1, wherein first and second filter elements are arranged on the suction and delivery sides, respectively, of the sucking means, the first filter element including the porous body containing the acid component capable of adsorbing the alkali component by reaction.

16. A filter device according to claim 15, further comprising means for measuring and detecting the content of an alkali component in a gas passed through the first filter element.

17. A filter device according to claim 16, further comprising alarm means for giving an alarm when a threshold value is exceeded by the detected content of the alkali component.

18. A filter device according to claim 15, wherein said first filter element has a two-stage structure.

19. A resist-treatment system having a filter means for removing impurities from the outside air, comprising:
   resist coating means for applying a resist to a substrate;
   baking means for baking the applied resist;
   developing means for developing the applied resist; and
   said filter means including a frame having an aperture through which the outside air is introduced into the resist-treatment system, sucking means for sucking the outside air into the aperture, and a filter element supported by means of the frame so as to be situated at least on one side the sucking means, the filter element including a porous body containing an acid component capable of adsorbing an alkali component by reaction.

20. A resist-treatment system according to claim 19, further comprising exposure means for exposing the resist applied to the substrate.

* * * * *